(12) United States Patent
Bakker et al.

(10) Patent No.: US 6,198,267 B1
(45) Date of Patent: Mar. 6, 2001

(54) CURRENT GENERATOR FOR DELIVERING A REFERENCE CURRENT OF WHICH THE VALUE IS PROPORTIONAL TO THE ABSOLUTE TEMPERATURE

(75) Inventors: Anthonius Bakker, Delft; Johan H. Huijsing, Schipluiden, both of (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/439,239

(22) Filed: Nov. 12, 1999

(30) Foreign Application Priority Data

Nov. 12, 1998 (EP) .................................... 98203826

(51) Int. Cl.[7] ....................................................... G05F 3/16
(52) U.S. Cl. ............................................ 323/316; 323/317
(58) Field of Search .................................. 323/312, 315, 323/316, 317

(56) References Cited

U.S. PATENT DOCUMENTS 4,334,198 * 6/1982 Malchow ............................. 323/315
5,982,221 * 11/1999 Tuthill ................................... 327/512

OTHER PUBLICATIONS

Anton Bakker and Johan H. Huijsing "Micropower CMOS Temperature Sensor with Digital Output" IEEE Journal of Solid–State Circuits, vol.31 No. 7 Jul. 1996 the whole document.

Ion E. Opris, "Series Resistance Compensation in Translinear Circuits", Jan 1998, IEEE, pp. 91–94.*

* cited by examiner

Primary Examiner—Peter S. Wong
Assistant Examiner—Gary L. Laxton
(74) Attorney, Agent, or Firm—Brian J. Wieghaus

(57) ABSTRACT

A current generator for delivering a reference current of which the value is proportional to the absolute temperature comprises first and second bipolar transistors ($Q_1$, $Q_2$) which are biased respectively by first and second current sources ($I_1$, $I_2$). The voltage difference between the emitters of the first and second bipolar transistors ($Q_1$, $Q_2$) is regulated to virtually zero volt by means of regulation means (RGMNS). Because of the presence of resistors ($R_1$–$R_3$) in series with the bases of the first and second bipolar transistors ($Q_1$, $Q_2$) instead of the presence of resistors in series with the emitters, the first and second bipolar transistors ($Q_1$, $Q_2$) can be chopped by switches without suffering from the disadvantageous effect of the undesired series resistances of the switches. For this reason by the chopping of the first and second bipolar transistors ($Q_1$, $Q_2$) the accuracy of the reference current is improved significantly.

7 Claims, 1 Drawing Sheet

CURRENT GENERATOR FOR DELIVERING A REFERENCE CURRENT OF WHICH THE VALUE IS PROPORTIONAL TO THE ABSOLUTE TEMPERATURE

BACKGROUND OF THE INVENTION

The invention relates to a current generator for delivering a reference current having a value which is proportional to the absolute temperature comprising an output terminal for delivering the current; a first and a second supply terminal for receiving a supply voltage; a first bipolar transistor having a collector coupled to the first supply terminal, a base, and an emitter; a second bipolar transistor having a collector coupled to the first supply terminal, a base, and an emitter; a first current source coupled in between the second supply terminal and the emitter of the first bipolar transistor; and a second current source coupled in between the second supply terminal and the emitter of the second bipolar transistor.

Such a current generator is known from the publication: "Micropower CMOS Temperature Sensor with Digital Output", IEEE Journal of Solid-State Circuits, Vol. 31, no. 7, July 1996, pages 933–937. In the known current generator the first and the second current sources are formed by respectively first and second PMOS-transistors of which theirs sources are coupled to the second supply terminal. A drain of the first PMOS-transistor is coupled to the emitter of the first bipolar transistor. A resistor is coupled in between a drain of the second PMOS-transistor and the emitter of the second bipolar transistor. The bases of the first and the second bipolar transistors are coupled to the first supply terminal. An operational amplifier is coupled with an inverting input to the drain of the first PMOS-transistor, with a non-inverting input to the drain of the second PMOS-transistor, and with an output to gates of the first and second PMOS-transistors. The operational amplifier controls a control voltage at the gates of the first and second PMOS-transistors in such a manner that the voltage difference between the drains of the first and the second PMOS-transistors is virtually equal to zero. By appropriate dimensioning of the components the voltage across the resistor is proportional to the absolute temperature. Also the currents flowing through the first and the second PMOS-transistors are proportional to the absolute temperature. In the known current generator a reference current which is proportional to the absolute temperature can be generated by the addition of a third PMOS-transistor of which its gate and source are connected to respectively the gates and sources of the first and second PMOS-transistors. The reference current can then be taken from the drain of the third PMOS-transistor.

Since reference currents are very often necessary in electronic circuits there is a need for alternative solutions.

SUMMARY OF THE INVENTION

It is therefore an object of the invention to provide a reference current of which the value is proportional to the absolute temperature.

To this end, according to the invention, the current generator of the type defined in the opening paragraph is characterised in that the current generator further comprises a resistor branch of resistors coupled in series, whereby a first end point of the resistor branch is coupled to the base of the first bipolar transistor, a second end point of the resistor branch is coupled to the base of the second bipolar transistor, and an internal node of the resistor branch is coupled to the first supply terminal; and regulation means for regulating the voltage between the emitters of the first and the second transistor to virtually zero volt by adapting a current flowing through at least a part of the resistor branch. This structure opens the possibility of chopping (interchange) the first and second bipolar transistors. The current generator may further be characterised in that the resistor branch comprises a first resistor coupled in between the first end point of the resistor branch and the internal node of the resistor branch; and a second resistor coupled in between the second end point of the resistor branch and the internal node of the resistor branch, and in that the at least part of the resistor branch is formed by the second resistor. The special construction of the novel current generator opens the possibility of designing a current generator which delivers a more accurate reference current. The first and the second resistors are coupled in series with the bases of the first and the second transistors instead of with resistors in series with the emitters of respectively the first and second transistors, as is common practice in the prior art. In this way the undesired resistances of switches which can be put in series with the first and second resistors in order to interchange periodically (chopping) the first and the second transistors for increasing the accuracy of the reference current, have a smaller effect. The effect is smaller because in the novel current generator the base currents of the first and second bipolar transistors flow through respectively the first and the second resistors instead of the emitter currents as is the case in known prior art. As a result the values of the first and second resistors are much higher than in the known prior art. This has the advantageous effect that the aforementioned undesired resistances have a less disadvantageous effect on the accuracy of the reference current. For this purpose the current generator of the type defined in the opening paragraph may alternatively be characterised in that the resistor branch comprises a first resistor coupled in between the first end point of the resistor branch and the internal node of the resistor branch, and a second resistor coupled in between the second end point of the resistor branch and a further internal node of the resistor branch, and a third resistor coupled in between the internal node and the further internal node; and in that the current generator further comprises a third current source, first switching means arranged for alternately coupling either the internal node to the first supply terminal during a first phase or the further internal node to the first supply terminal during a second phase, second switching means for alternately coupling either the second end point of the resistor branch to an output terminal of the regulation means during the first phase or the first end point of the resistor branch to the output terminal of the regulation means during the second phase, and third switching means for alternately coupling either the third current source in parallel with the first current source during the first phase or the third current source in parallel with the second current source during the second phase. By so doing the first and the second bipolar transistors are in fact interchanged periodically (chopped). As a consequence the effect of a matching error between the first and the second bipolar transistors is cancelled, and thus a higher accuracy of the reference current is achieved.

This embodiment may further be characterised in that the regulation means comprise an amplifier having a non-inverting input coupled to the emitter of the first bipolar transistor, an inverting input coupled to the emitter of the second bipolar transistor, a non-inverting output, and an inverting output; a differential to single-ended converter having a non-inverting input, an inverting input, and an output; fourth switching means for alternately coupling either the non-inverting output and the inverting output of the amplifier to respectively the non-inverting input and the inverting input of the differential to single-ended converter during the first phase or the non-inverting output and the inverting output of the amplifier to respectively the inverting input and the non-inverting input of the differential to single-ended converter during the second phase; and an output transistor having a control electrode coupled to the output of the differential to single-ended converter, a first main electrode coupled to the output terminal of the regulation means, and a second main electrode coupled to the output terminal of the current generator. The fourth switching means provide a stable behaviour of the regulation means irrespective whether the first, second, and third switching means operate in the first phase or in the second phase. At the same time also the DC-offset of the amplifier is cancelled.

BRIEF DESCRIPTION OF THE DRAWING

The invention will be described in more detail with reference to the accompanying drawings, in which.

DESCRIPTION OF THE PREFERRED EMBODIMENTS

In these Figures parts or elements having like functions or purposes bear the same reference symbols.

Figure 1:
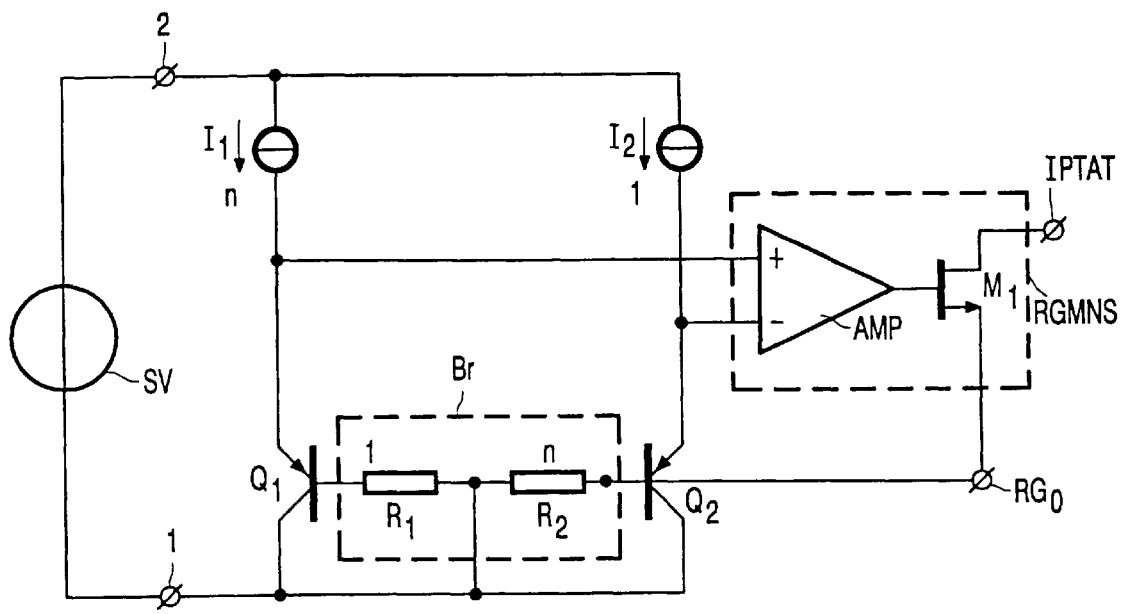
FIG. 1 is a circuit diagram of a first embodiment of a current generator according to the invention.

FIG. 1 shows a circuit diagram of a first embodiment of a current generator according to the invention. The current generator comprises: first and second bipolar transistors $Q_1$ and $Q_2$, first and second current sources $I_1$ and $I_2$, a resistor branch Br consisting of first and second resistors $R_1$ and $R_2$, and regulation means RGMNS comprising an amplifier AMP and an output transistor $M_1$. The current generator receives a supply voltage between first and second supply terminals 1 and 2 delivered by a supply voltage source SV. The collectors of the first and the second bipolar transistors $Q_1$ and $Q_2$ are connected to the first supply terminal 1. The first and the second current sources $I_1$ and $I_2$ are respectively connected in between the second supply terminal 2 and the emitter of the first bipolar transistor $Q_1$ and in between the second supply terminal 2 and the emitter of the second bipolar transistor $Q_2$. A first electrode of the first resistor $R_1$ forms a first end point of the resistor branch Br and is connected to the base of the first transistor $Q_1$. A first electrode of the second resistor $R_2$ forms a second end point of the resistor branch Br and is connected to the base of the second transistor $Q_2$. Second electrodes of the first and the second resistors $R_1$ and $R_2$ are connected to each other to form an internal node of the resistor branch Br. The internal node is connected to the first supply terminal 1. The amplifier AMP has a non-inverting input connected to the emitter of the first bipolar transistor $Q_1$, an inverting input connected to the emitter of the second bipolar transistor $Q_2$, and an output connected to a gate of the output transistor $M_1$. A source of the output transistor $M_1$ forms an output $RG_0$ of the regulation means RGMNS and is connected to the second end point of the resistor branch Br. A drain of the output transistor $M_1$ is connected to an output terminal IPTAT of the reference current.

The regulation means RGMNS regulates the voltage difference between the emitters of the first and the second bipolar transistors $Q_1$ and $Q_2$ to virtually zero volt by adapting the current flowing through the second resistor $R_2$. The reference current can be taken from the output terminal IPTAT. If the quotient of the value of the current delivered by the first current source $I_1$ and the value of the current delivered by the second current source $I_2$ is equal to the quotient of the value of the second resistor $R_2$ and the value of the first resistor $R_1$, then the value of the reference current is substantially dependent on the value of the absolute temperature. However due to mismatch of the components of the current generator, e.g. a mismatch between the first and second bipolar transistors $Q_1$ and $Q_2$, the reference current can be insufficient accurate for some electronic circuits which require a very high accuracy of the reference current. Also a deviation in the reference current is caused by a DC-offset of the amplifier AMP.

Figure 2:
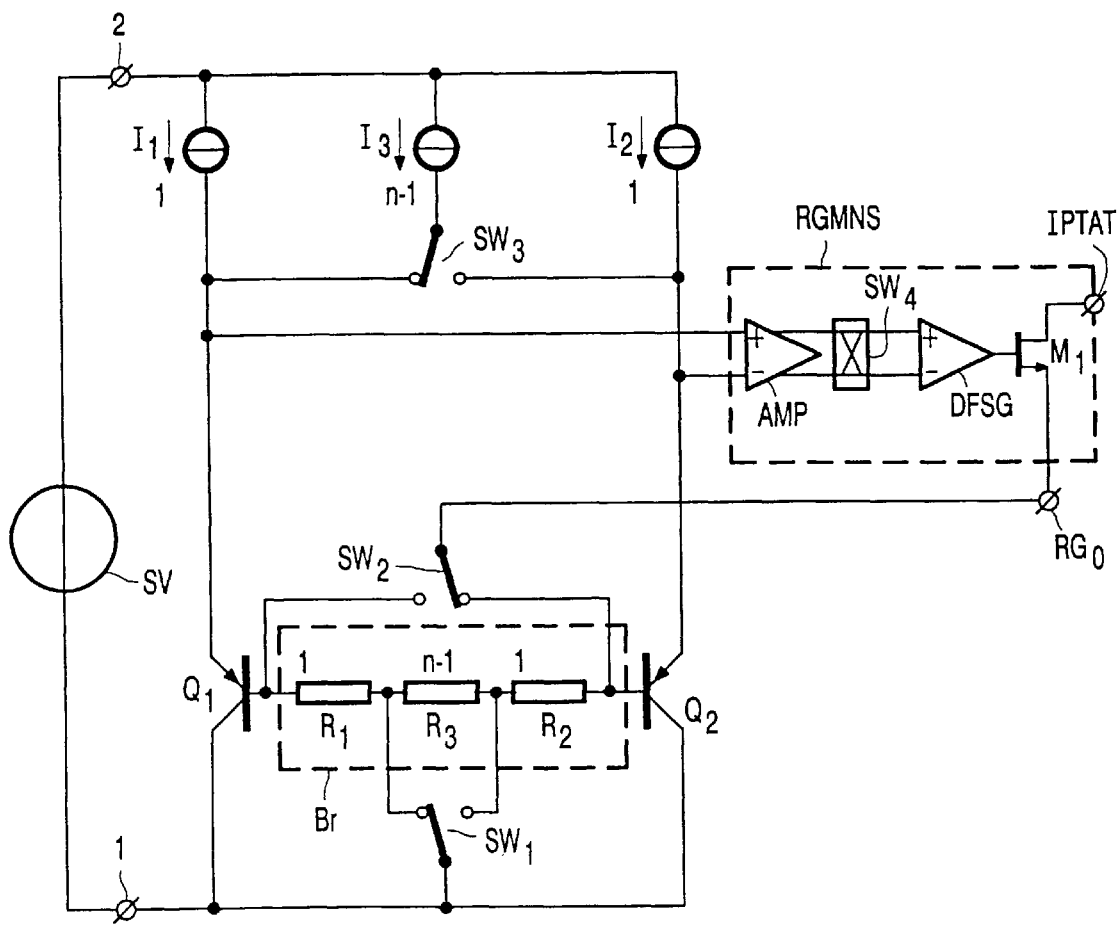
FIG. 2 is a circuit diagram of a second embodiment of a current generator according to the invention.

FIG. 2 shows a circuit diagram of a second embodiment of a current generator according to the invention. With this embodiment a more accurate reference current, which is proportional to the absolute temperature, can be generated. The resistor branch Br consists of first, second, and third resistors $R_1$–$R_3$. In contrast to the first embodiment the first and second resistors $R_1$ and $R_2$ are not connected directly to each other to form the internal node of the resistor branch Br. In this embodiment the first resistor $R_1$ is connected in between the base of the first bipolar transistor $Q_1$ and the internal node of the resistor branch Br (which is not directly connected to the first supply terminal 1), and the second resistor $R_2$ is connected in between the base of the second bipolar transistor $Q_2$ and a further internal node of the resistor branch Br. The third resistor $R_3$ is connected in between the internal node and the further internal node. The current generator further comprises a third current source $I_3$, first until fourth switching means $SW_1$–$SW_4$, and a differential to single-ended converter DFSG. In contrast to the first embodiment the amplifier AMP has a non-inverting and an inverting output. The fourth switching means $SW_4$ are coupled in between the non-inverting output and the inverting output of the amplifier AMP, and the non-inverting input and the inverting input of the differential to single-ended converter DFSG. The output of the differential to single-ended converter DFSG is connected to the gate of the output transistor $M_1$. Preferably the value of the current delivered by the first current source $I_1$ is equal to the value of the current delivered by the second current source $I_2$, the value of the first resistor $R_1$ is equal to the value of the second resistor $R_2$, and the quotient of the value of the current delivered by the third current source $I_3$ and the value of the current delivered by the first current source $I_1$ is equal to the quotient of the value of the third resistor $R_3$ and the value of the first resistor $R_1$.

The operation of the circuit is as follows: During a first phase $PHI_1$ the internal node (the common junction of the first and the third resistors $R_1$ and $R_3$) is connected to the first supply terminal 1; the base of the second transistor $Q_2$ is connected to the output $RG_0$ of the regulation means RGMNS; the third current source $I_3$ is connected in parallel with the first current source $I_1$; and the non-inverting output and the inverting output of the amplifier AMP are connected to respectively the non-inverting input and the inverting input of the differential to single-ended converter DFSG. In this situation the current generator functions in the same way as the current generator as shown in FIG. 1. In FIG. 1 the first bipolar transistor $Q_1$ is biased by $I_1=n*I_2$, in FIG. 2 the first bipolar transistor $Q_1$ is biased by $I_1+I_3=1*I_2+(n-1)*I_2=n*I_2$. In FIG. 1 as well as in FIG. 2 the base of the first bipolar transistor $Q_1$ is connected to the first supply terminal 1 via the first resistor $R_1$. In FIG. 1 the base of the second bipolar transistor $Q_2$ is connected to the first supply terminal 1 via $R_2=n*R_1$, in FIG. 2 the base of the second bipolar transistor $Q_2$ is connected to the first supply terminal 1 via $R_2+R_3=1*R_1+(n-1)*R_1=n*R_1$. Further in FIG. 2 the combination of the amplifier AMP, the fourth switching means $SW_4$, and the differential to single-ended converter DFSG functions in the same way as the amplifier AMP in FIG. 1.

During the second phase $PHI_2$ the further internal node (the common junction of the second and the third resistors $R_2$ and $R_3$) is connected to the first supply terminal 1; the base of the first transistor $Q_1$ is connected to the output $RG_O$ of the regulation means RGMNS; the third current source $I_3$ is connected in parallel with the second current source $I_2$; and the non-inverting output and the inverting output of the amplifier AMP are connected to respectively the inverting input and the non-inverting input of the differential to single-ended converter DFSG. In this situation the current generator also functions in the same way as the current generator as shown in FIG. 1 with the difference however that the first transistor $Q_1$ and the second transistor $Q_2$ are interchanged.

Because the first transistor $Q_1$ and the second transistor $Q_2$ are continuously interchanged ("chopped") their mutual mismatch is cancelled. Since also the connections to the inputs of the amplifier AMP are chopped and the connections from the outputs of the amplifier AMP to the inputs of the differential to single-ended converter DFSG are chopped the DC-offset of the amplifier AMP is cancelled. Also the noise produced by the amplifier AMP is reduced for frequencies lower than the chopping frequency of the switching means $SW_1$–$SW_4$. A DC-offset and the noise of the differential to single-ended converter DFSG is negligible because its influence is reduced by the gain of the amplifier AMP.

It is to be noted that a further improvement of the accuracy of the reference current can be achieved if a so-called dynamic element matching of the first until the third current sources $I_1$–$I_3$ is applied.

The inventive circuit can be implemented with discrete components as well as with an integrated circuit. Instead of using a field effect transistor for the output transistor $M_1$ also a bipolar transistor can be used. It is also possible to implement the output transistor $M_1$ by a so-called darlington transistor (which comprises an combination of several transistors). It is further possible to use transistors of opposite polarity for the transistors $Q_1$, $Q_2$, and $M_1$. The polarity of the supply voltage SV and the current sources $I_1$ and $I_2$ should then be adapted accordingly.

What is claimed is:

1. A current generator for delivering a reference current having a value which is proportional to the absolute temperature comprising:

an output terminal (IPTAT) for delivering the reference current;

a first (1) and a second (2) supply terminal for receiving a supply voltage;

a first bipolar transistor ($Q_1$) having a collector coupled to the first supply terminal (1), a base, and an emitter;

a second bipolar transistor ($Q_2$) having a collector coupled to the first supply terminal (1), a base, and an emitter;

a first current source ($I_1$) coupled in between the second supply terminal (2) and the emitter of the first bipolar transistor ($Q_1$);

a second current source ($I_2$) coupled in between the second supply terminal (2) and the emitter of the second bipolar transistor ($Q_2$), a resistor branch (Br) of resistors coupled in series, wherein a first end point of the resistor branch (Br) is coupled to the base of the first bipolar transistor ($Q_1$), a second end point of the resistor branch (Br) is coupled to the base of the second bipolar transistor ($Q_2$), and an internal node of the resistor branch (Br) is coupled to the first supply terminal (1); and a regulator (RGMNS) for regulating the voltage between the emitters of the first ($Q_1$) and the second ($Q_2$) transistor to virtually zero volt by providing a current through at least part of the resistor branch (Br).

2. The current generator as claimed in claim 1, characterised in that:

the resistor branch (Br) comprises:

a first resistor ($R_1$) coupled in between the first end point of the resistor branch (Br) and the internal node of the resistor branch (Br); and a second resistor ($R_2$) coupled in between the second end point of the resistor branch (Br) and the internal node of the resistor branch (Br), and the at least part of the resistor branch (Br) is formed by the second resistor ($R_2$).

3. The current generator as claimed in claim 2, characterised in that the regulator (RGMNS) comprises:

an amplifier (AMP) having:

a non-inverting input coupled to the emitter of the first bipolar transistor ($Q_1$), an inverting input coupled to the emitter of the second bipolar transistor ($Q_2$), and an output; and an output transistor ($M_1$) having:

a control electrode coupled to the output of the amplifier (AMP), a first main electrode coupled to the base of the second bipolar transistor ($Q_2$), and a second main electrode coupled to the output terminal (IPTAT) of the current generator.

4. The current generator as claimed in claim 3, characterised in that a quotient of a value of the current delivered by the first current source ($I_1$) and a value of the current delivered by the second current source ($I_2$) is substantial equal to a quotient of a value of the second resistor ($R_2$) and a value of the first resistor ($R_1$).

5. The current generator as claimed in claim 1, characterised in that:

the resistor branch (Br) comprises:

a first resistor ($R_1$) coupled in between the first end point of the resistor branch (Br) and the internal node of the resistor branch (Br), a second resistor ($R_2$) coupled in between the second end point of the resistor branch (Br) and a further internal node of the resistor branch (Br), and a third resistor ($R_3$) coupled in between the internal node and the further internal node; and the current generator further comprises:

a third current source ($I_3$), first switching means ($SW_1$) arranged for alternately coupling either the internal node to the first supply terminal (1) during a first phase ($PHI_1$) or the further internal node to the first supply terminal (1) during a second phase ($PHI_2$), second switching means ($SW_2$) for alternately coupling either the second end point of the resistor branch (Br) to an output terminal ($RG_O$) of the regulator (RGMNS) during the first phase ($PHI_1$) or the first end point of the resistor branch (Br) to the output terminal ($RG_O$) of the regulator (RGMNS) during the second phase ($PHI_2$), and third switching means ($SW_3$) for alternately coupling either the third current source ($I_3$) in parallel with the first current source ($I_1$) during the first phase ($PHI_1$) or the third current source ($I_3$) in parallel with the second current source ($I_2$) during the second phase ($PHI_2$).

6. The current generator as claimed in claim 5, characterised in that the regulator (RGMNS) comprises:

an amplifier (AMP) having:
a non-inverting input coupled to the emitter of the first bipolar transistor ($Q_1$),
an inverting input coupled to the emitter of the second bipolar transistor ($Q_2$),
a non-inverting output, and
an inverting output;

a differential to single-ended converter (DFSG) having:
a non-inverting input, an inverting input, and an output;

fourth switching means ($SW_4$) for alternately coupling either the non-inverting output and the inverting output of the amplifier (AMP) to, respectively, the non-inverting input and the inverting input of the differential to single-ended converter (DFSG) during the first phase ($PHI_1$) or the non-inverting output and the inverting output of the amplifier (AMP) to, respectively, the inverting input and the non-inverting input of the differential to single-ended converter (DFSG) during the second phase ($PHI_2$); and an output transistor ($M_1$) having:
a control electrode coupled to the output of the differential to single-ended converter (DFSG),
a first main electrode coupled to the output terminal ($RG_O$) of the regulator (RGMNS), and
a second main electrode coupled to the output terminal (IPTAT) of the current generator.

7. The current generator as claimed in claim 6, characterised in that a value of the current delivered by the first current source ($I_1$) is virtually equal to a value of the current delivered by the second current source ($I_2$), and that a value of the first resistor ($R_1$) is virtually equal to a value of the second resistor ($R_2$), and that a quotient of a value of the current delivered by the third current source ($I_3$) and a value of the current delivered by the first current ($I_1$) is substantially equal to a quotient of a value of the third resistor ($R_3$) and a value of the first resistor ($R_1$).

* * * * *